United States Patent
Nakanishi et al.

(10) Patent No.: US 9,651,607 B2
(45) Date of Patent: May 16, 2017

(54) PHOTO DEVICE INSPECTION APPARATUS AND PHOTO DEVICE INSPECTION METHOD

(71) Applicants: DAINIPPON SCREEN MFG. CO., LTD., Kyoto-shi, Kyoto (JP); OSAKA UNIVERSITY, Suita-shi, Osaka (JP)

(72) Inventors: Hidetoshi Nakanishi, Kyoto (JP); Akira Ito, Kyoto (JP); Iwao Kawayama, Suita (JP); Masayoshi Tonouchi, Suita (JP)

(73) Assignees: SCREEN HOLDINGS CO., LTD., Kyoto (JP); OSAKA UNIVERSITY, Osaka (JP)

( * ) Notice: Subject to any disclaimer, the term of this patent is extended or adjusted under 35 U.S.C. 154(b) by 303 days.

(21) Appl. No.: 14/327,383

(22) Filed: Jul. 9, 2014

(65) Prior Publication Data

US 2015/0015297 A1 Jan. 15, 2015

(30) Foreign Application Priority Data

Jul. 10, 2013 (JP) ................................. 2013-144127

(51) Int. Cl.
*H02S 50/00* (2014.01)
*H02S 50/10* (2014.01)
*G01R 31/26* (2014.01)

(52) U.S. Cl.
CPC .......... *G01R 31/2605* (2013.01); *H02S 50/00* (2013.01); *H02S 50/10* (2014.12)

(58) Field of Classification Search
None
See application file for complete search history.

(56) References Cited

U.S. PATENT DOCUMENTS

| 8,129,683 B2 | 3/2012 | Itsuji et al. |
| 8,446,145 B2 | 5/2013 | Taira et al. |
| 2004/0056648 A1* | 3/2004 | Matsuyama ............ H02S 50/10 324/96 |

(Continued)

FOREIGN PATENT DOCUMENTS

| EP | 2574906 A1 | 4/2013 |
| JP | 2009-175127 A | 8/2009 |

(Continued)

OTHER PUBLICATIONS

Extended European Search Report dated Jun. 18, 2015 issued in European Patent Application No. 14176178.3.

*Primary Examiner* — Melissa Koval
*Assistant Examiner* — Felicia Farrow
(74) *Attorney, Agent, or Firm* — McDermott Will & Emery LLP

(57) ABSTRACT

A photo device inspection apparatus is an apparatus for inspecting a solar cell panel, which is a photo device. The photo device inspection apparatus includes an irradiation part configured to irradiate the solar cell panel with pulsed light radiated from a femtosecond laser, which is a light source, an electromagnetic wave detection part configured to detect a pulse of an electromagnetic wave radiated from the solar cell panel in response to irradiation with the pulsed light, and a current detection part configured to detect a current generated by the solar cell panel in response to irradiation with the pulsed light.

4 Claims, 13 Drawing Sheets

(56) References Cited

U.S. PATENT DOCUMENTS

| | | | |
|---|---|---|---|
| 2009/0009203 A1 | 1/2009 | Sunaoshi et al. | |
| 2009/0027664 A1* | 1/2009 | Hamamatsu | G01N 21/9501 356/237.5 |
| 2011/0216312 A1* | 9/2011 | Matsumoto | G01N 21/9501 356/237.1 |
| 2013/0015368 A1* | 1/2013 | Nakanishi | G01N 21/3586 250/459.1 |
| 2013/0021054 A1* | 1/2013 | Voltan | G01R 31/405 324/761.01 |

FOREIGN PATENT DOCUMENTS

| | | |
|---|---|---|
| JP | 2010-182969 A | 8/2010 |
| JP | 2013-19861 A | 1/2013 |

* cited by examiner

F I G. 1
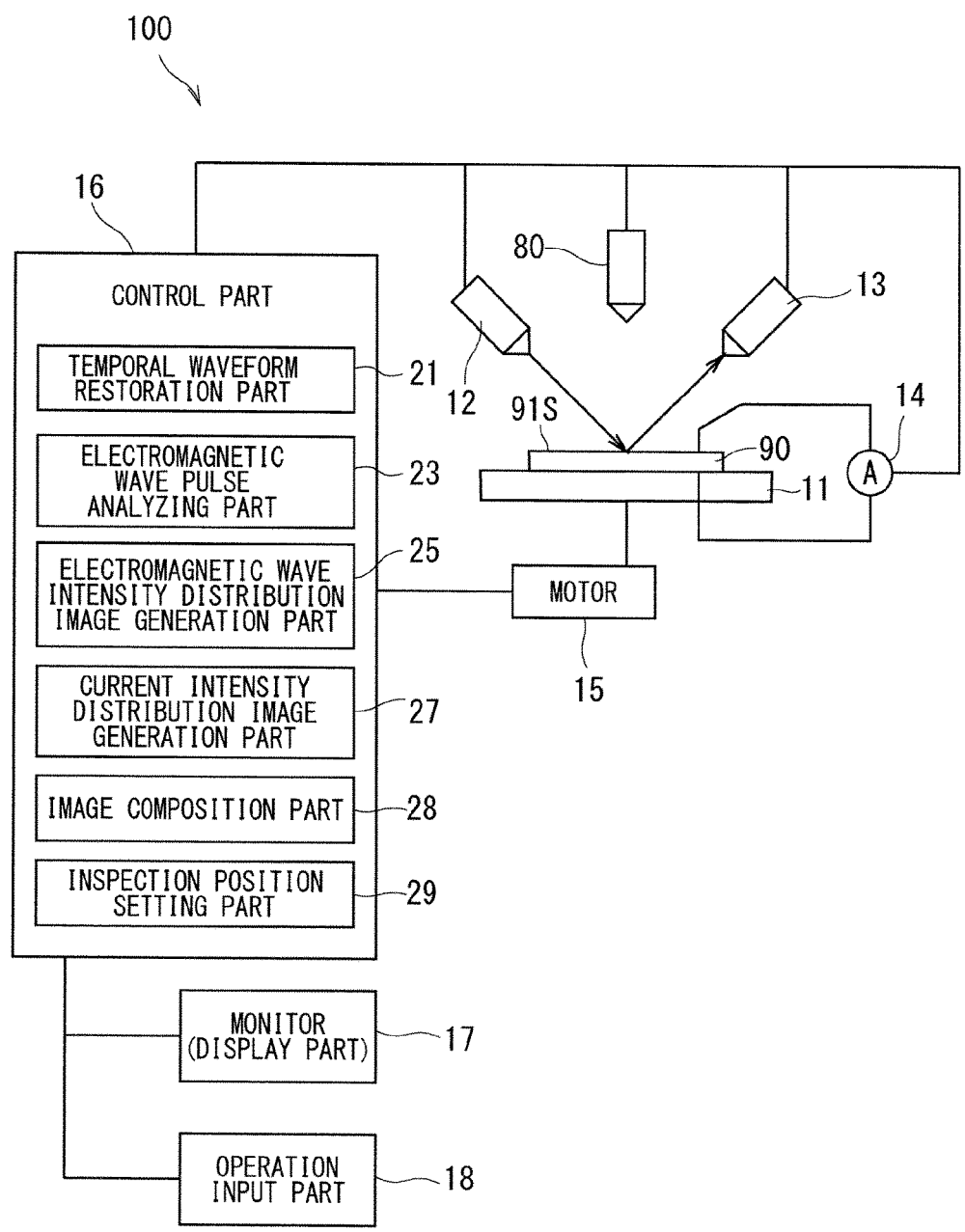

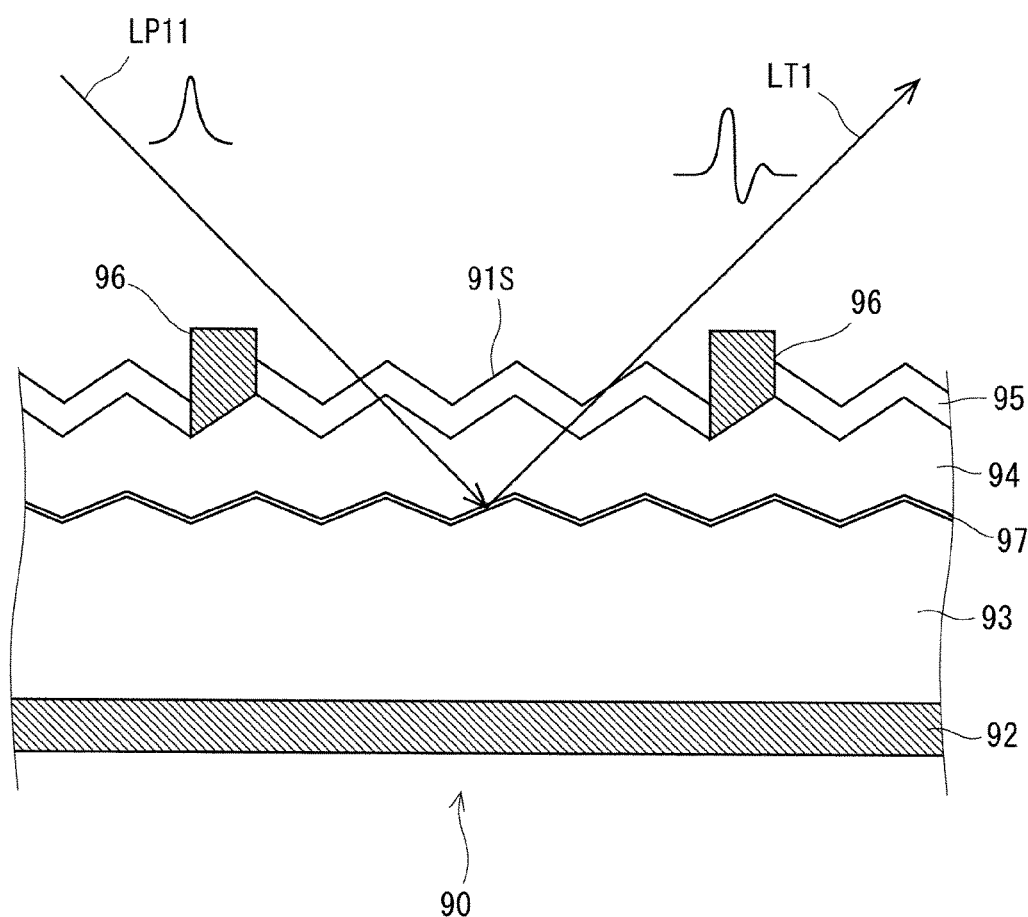
F I G . 3

F I G . 4
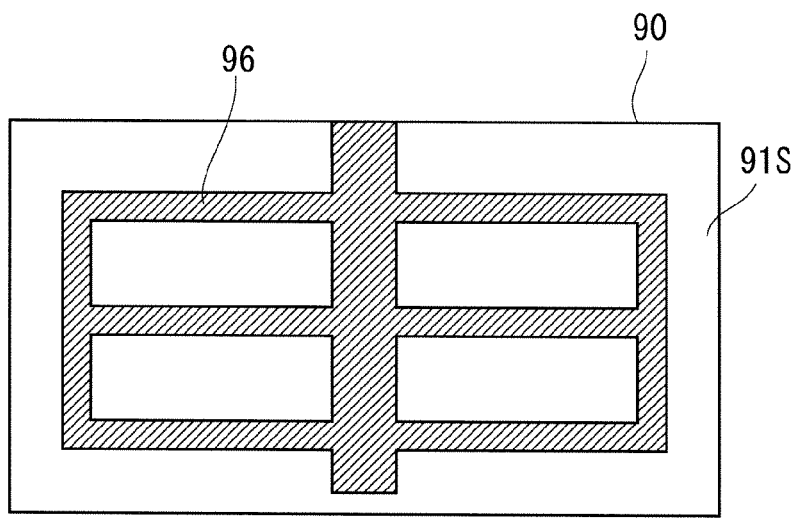

F I G. 6
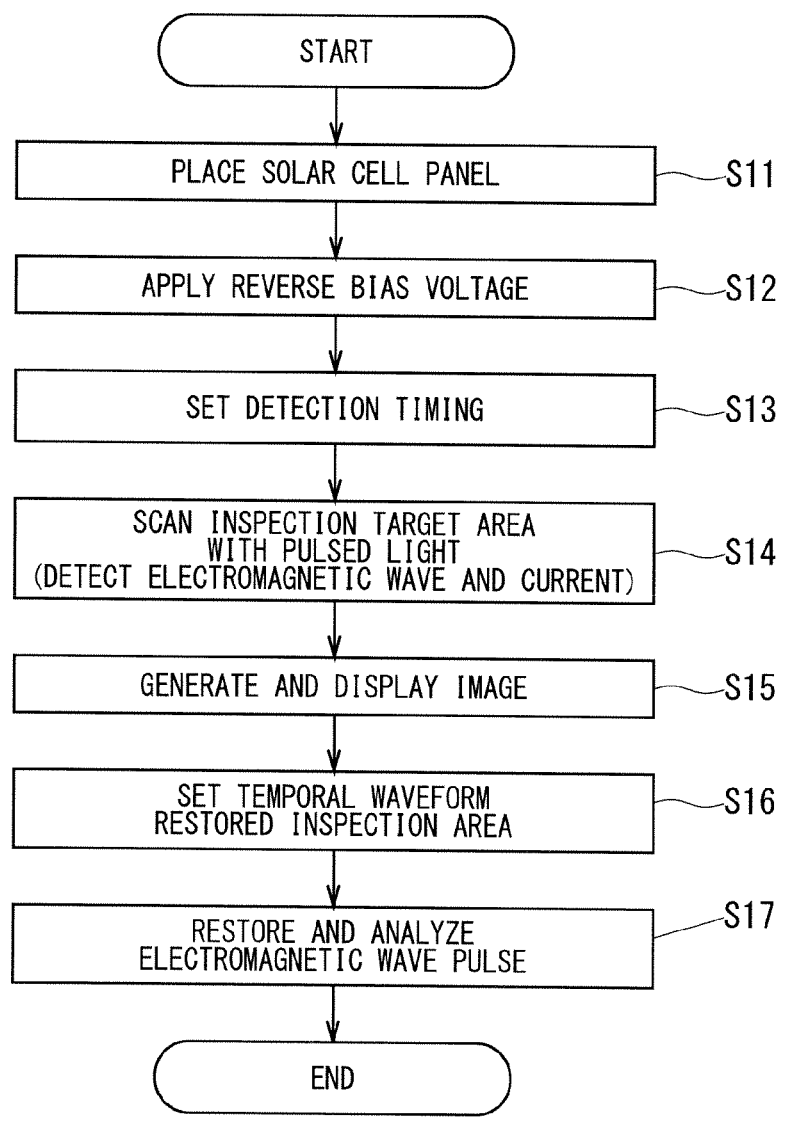

F I G . 7
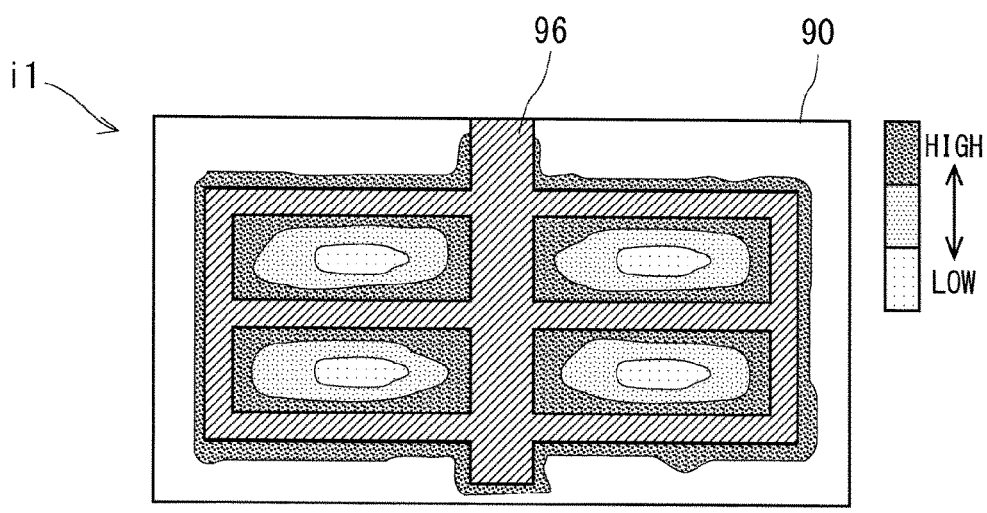

F I G. 1 1
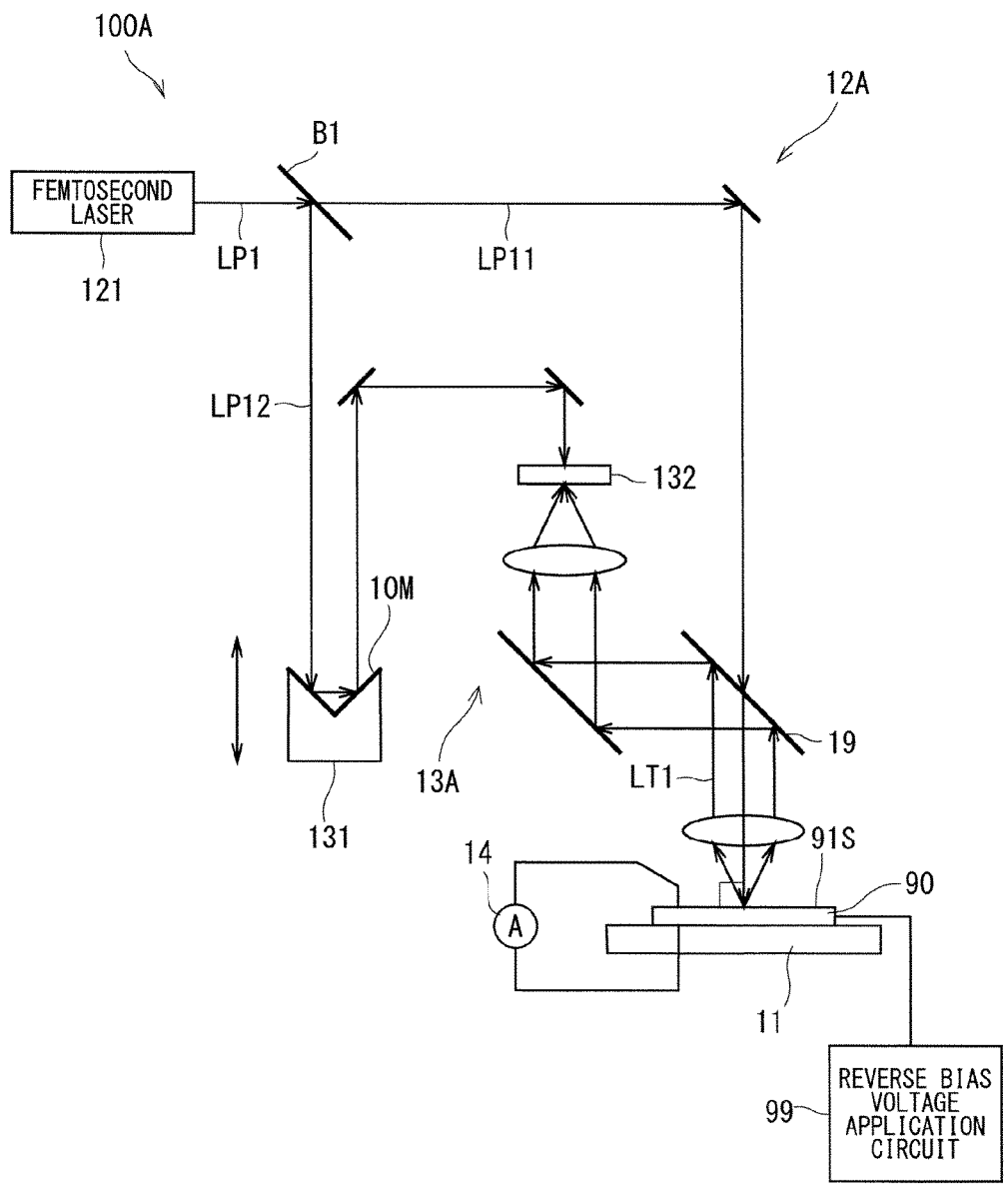

F I G . 1 2
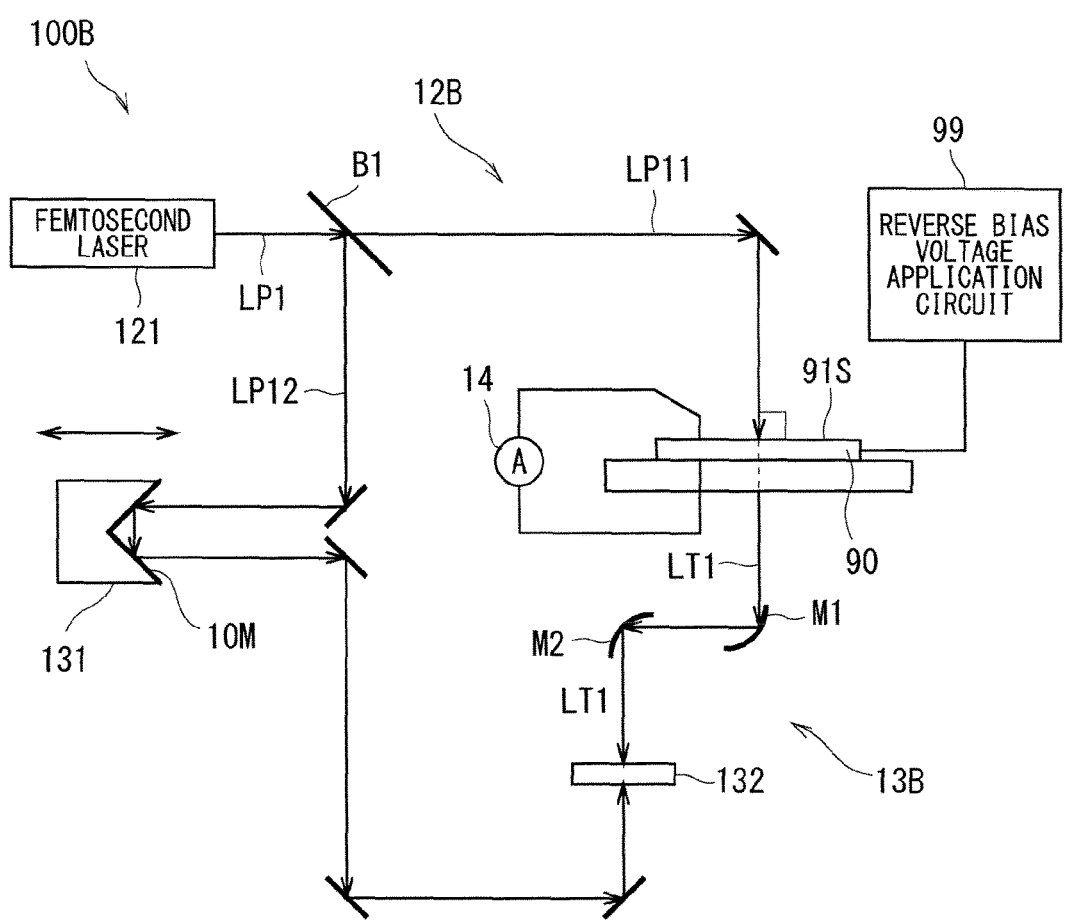

PHOTO DEVICE INSPECTION APPARATUS AND PHOTO DEVICE INSPECTION METHOD

BACKGROUND OF THE INVENTION

Field of the Invention

The present invention relates to a technique for inspecting a photo device.

Description of the Background Art

Various techniques for inspecting a photo device have been proposed (see, for example, Japanese Patent Application Laid-Open Nos. 2010-182969 and 2013-019861).

For example, Japanese Patent Application Laid-Open No. 2010-182969 discloses a technique for inspecting a solar cell, which is a photo device, by irradiating the solar cell with artificial sunlight to generate a current and detecting the current. Japanese Patent Application Laid-Open No. 2013-019861 discloses a technique for inspecting a photo device by irradiating the photo device with pulsed light to radiate an electromagnetic wave and detecting pulses of the electromagnetic wave.

SUMMARY OF THE INVENTION

The light source used in the solar cell in Japanese Patent Application Laid-Open No. 2010-182969 emits artificial sunlight (continuous light) and is different in type from the light source of Japanese Patent Application Laid-Open No. 2013-019861 that emits pulsed light. In order to measure a current and an electromagnetic wave generated by the photo device, it is necessary to separately prepare light sources suitable for the respective measurements, which poses a problem of an increase in the cost of the apparatus.

The present invention is directed to a photo device inspection apparatus for inspecting a photo device.

A photo device inspection apparatus according to a first aspect of the present invention includes an irradiation part configured to irradiate the photo device with light radiated from a light source, an electromagnetic wave detection part configured to detect an electromagnetic wave radiated from the photo device in response to irradiation with the light, and a current detection part configured to detect a current generated by the photo device in response to irradiation with the light.

With the photo device inspection apparatus of the first aspect, it is possible to use the same light source to detect the electromagnetic wave radiated from the photo device and the current generated by the photo device. This enables inspection based on the electromagnetic wave and the current while suppressing an increase in the cost of the apparatus.

According to a second aspect of the present invention, in the photo device inspection apparatus of the first aspect, the irradiation part includes a scanning mechanism configured to scan an inspection target area of the photo device with the light.

With the photo device inspection apparatus of the second aspect, it is possible to efficiently apply light to the inspection target area and generate an electromagnetic wave or a current.

According to a third aspect of the present invention, the photo device inspection apparatus of the second aspect further includes an electromagnetic wave intensity distribution image generation part configured to generate an electromagnetic wave intensity distribution image that indicates an intensity distribution of the electromagnetic wave generated in the inspection target area.

With the photo device inspection apparatus of the third aspect, the electromagnetic wave intensity distribution can be visually recognized. Accordingly, a defective area or the like can be easily specified.

According to a fourth aspect of the present invention, in the photo device inspection apparatus according to any one of the first to third aspects, the light source is a femtosecond laser, and the detection part includes a detector configured to detect the electromagnetic wave by receiving probe light radiated from the femtosecond laser, and a delay part configured to delay a timing of incidence of the probe light on the detector relative to a timing of incidence of the electromagnetic wave on the detector, the photo device inspection apparatus further including a temporal waveform restoration part configured to restore a temporal waveform of the electromagnetic wave on the basis of an electric field strength of the electromagnetic wave detected by operating the delay part.

With the photo device inspection apparatus of the fourth aspect, the temporal waveform of the electromagnetic wave can be restored, and thus the characteristics of the photo device can be analyzed in more detail.

According to a fifth aspect of the present invention, the photo device inspection apparatus according to the fourth aspect further includes an inspection position setting part configured to set a position to which the irradiation part applies the light, in order to restore the temporal waveform.

With the photo device inspection apparatus of the fifth aspect, inspection for restoring the electromagnetic wave, which requires a relatively long time, can be conducted at only the set position, and thus an improvement in inspection efficiency can be achieved.

According to a sixth aspect of the present invention, the photo device inspection apparatus of the second aspect further includes a current intensity distribution image generation part configured to generate a current intensity distribution image that indicates an intensity distribution of the current generated in the inspection target area.

With the photo device inspection apparatus of the sixth aspect, the current intensity distribution can be visually recognized. Accordingly, a defective area or the like can be easily specified.

According to a seventh aspect of the present invention, the photo device inspection apparatus of the sixth aspect further includes an electromagnetic wave intensity distribution image generation part configured to generate an electromagnetic wave intensity distribution image that indicates an intensity distribution of the electromagnetic wave generated in the inspection target area, and an image composition part configured to composite the current intensity distribution image and the electromagnetic wave intensity distribution image.

With the photo device inspection apparatus of the seventh aspect, it is possible to obtain a composite image from which the intensity distribution of the electromagnetic wave and the intensity distribution of the current can be simultaneously recognized.

According to an eighth aspect of the present invention, the photo device inspection apparatus of the second aspect further includes a determining part configured to determine whether or not the current detected by the current detection part has an intensity that satisfies a pre-set reference value, the scanning mechanism scans an area in which the reference value is not satisfied with the light, and the electromagnetic wave detection part detects an electromagnetic wave generated by the scanning.

With the photo device inspection apparatus of the eighth aspect, detection of the electromagnetic wave, which requires a relatively long time, can be performed in a limited manner, and thus an improvement in inspection efficiency can be achieved.

The present invention is also directed to a photo device inspection method for inspecting a photo device.

A photo device inspection method according to a ninth aspect of the present invention includes the steps of (a) irradiating the photo device with light radiated from a light source, (b) detecting an electromagnetic wave radiated from the photo device in response to irradiation with the light, and (c) detecting a current generated by the photo device in response to irradiation with the light.

According to a tenth aspect of the present invention, the step (a) in the photo device inspection method of the ninth aspect includes a step (a-1) of scanning an inspection target area of the photo device with the light.

It is an object of the present invention to provide a technique for measuring a current and an electromagnetic wave generated by a photo device in response to light irradiation at a low cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates a schematic configuration of a photo device inspection apparatus according to a first preferred embodiment of the present invention;

FIG. 3 is a schematic cross-sectional view of a solar cell panel;

FIG. 4 is a plan view of the solar cell panel as viewed from the light-receiving surface side thereof;

FIG. 6 is a flowchart of Inspection Example 1 of a solar cell panel;

FIG. 7 illustrates an electromagnetic wave intensity distribution image;

FIG. 11 illustrates a schematic configuration of an irradiation part and a detection part of a photo device inspection apparatus according to a second preferred embodiment of the present invention;

FIG. 12 illustrates a schematic configuration of an irradiation part and a detection part of a photo device inspection apparatus according to a third preferred embodiment of the present invention.

DESCRIPTION OF THE PREFERRED EMBODIMENTS

Figure 2:
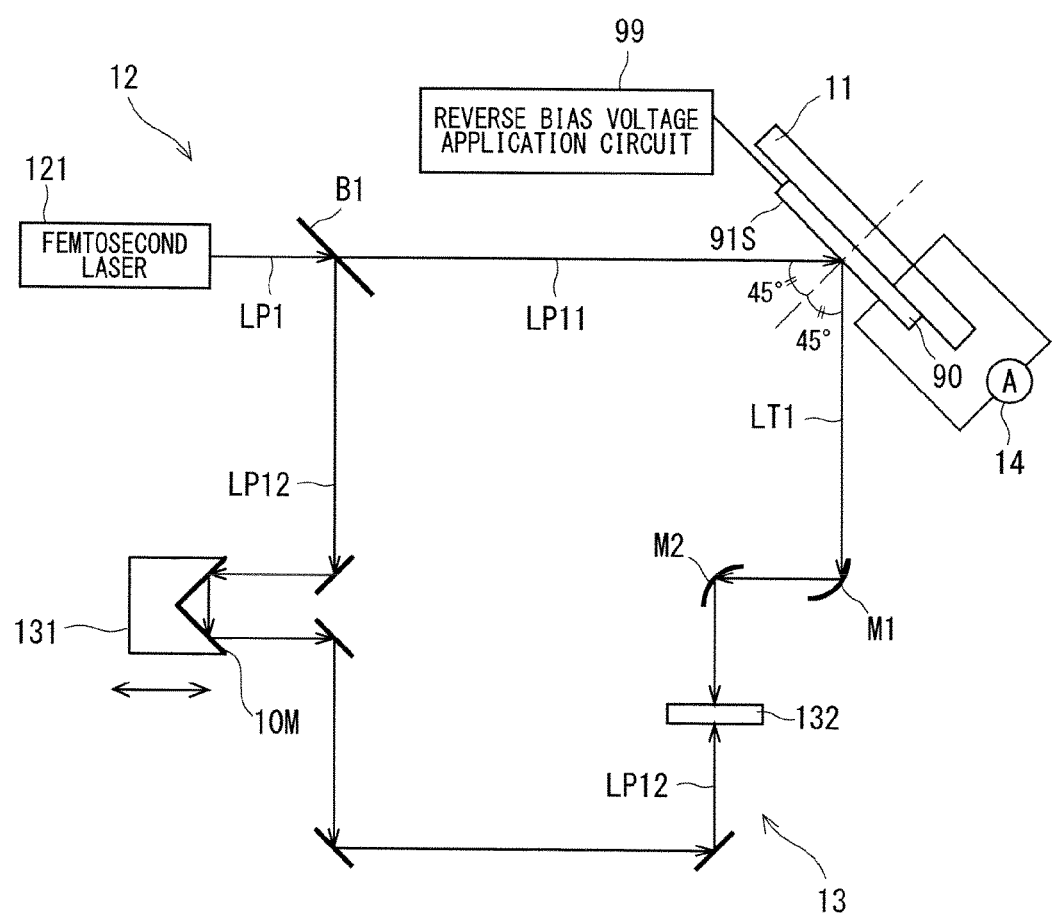
FIG. 2 illustrates a schematic configuration of an irradiation part and a detection part shown in FIG. 1.

Hereinafter, preferred embodiments of the present invention will be described with reference to the accompanying drawings. In the drawings, the dimensions and number of constituent elements may be shown in an exaggerated or simplified manner as needed in order to facilitate understanding of the drawings.

1. First Preferred Embodiment 1.1. Configuration and Function of Photo device Inspection Apparatus FIG. 1 illustrates a schematic configuration of a photo device inspection apparatus 100 according to a first preferred embodiment of the present invention. FIG. 2 illustrates a schematic configuration of an irradiation part 12 and an electromagnetic wave detection part 13 shown in FIG. 1.

The photo device inspection apparatus 100 is configured to be suitable for inspecting the characteristics of a solar cell panel 90, which is a substrate having a photo device formed thereon. A photo device such as a solar cell includes, for example, a pn junction in which a p-type semiconductor and an n-type semiconductor are joined. In the vicinity of the pn junction, a diffusion current is generated as a result of electrons and holes being diffused and bonded to each other, and thereby a depletion layer is formed in the vicinity of the pn junction, the depletion layer being a layer in which there are almost no electrons and holes. In this area, a force that attracts electrons and holes respectively back to the n-type area and the p-type area occurs, so that an electric field (internal electric field) is generated inside the photo device.

When the pn junction is irradiated with light having an energy exceeding the band gap, free electrons and free holes generated in the pn junction migrate due to the internal electric field. Specifically, the free electrons migrate toward the n-type semiconductor, and the free holes left behind migrate toward the p-type semiconductor. In the photo device, this current is discharged to the outside via electrodes provided respectively in the n-type semiconductor and the p-type semiconductor. In the case of a solar cell, for example, the migration of free electrons and free holes occurring when the depletion layer of the pn junction is irradiated with light is used as a direct current.

The inventors of the present invention found that electromagnetic wave pulses having a specific wavelength are generated when pulsed light having a predetermined wavelength is applied to a photo device. According to the Maxwell equation, when a change occurs in the current, an electromagnetic wave having an intensity that is proportional to a time derivative of the current is generated. In other words, as a result of pulsed light being applied to a photoexcited carrier generation area such as a depletion layer, instantaneous generation and extinction of photocurrent occur. Electromagnetic wave pulses are generated proportionally to the time derivative of the instantaneously generated photocurrent.

The occurrence of photocurrent is a reflection of the characteristics of a photoexcited carrier generation area such as the depletion layer. Accordingly, analyzing the generated electromagnetic wave pulses enables inspection of the characteristics of the photoexcited carrier generation area such as the depletion layer. Based on such principles, the photo device inspection apparatus 100 is configured to detect electromagnetic wave pulses generated when pulsed light having a predetermined wavelength is applied to the solar cell panel 90.

As shown in FIG. 1, the photo device inspection apparatus 100 includes a stage 11, an irradiation part 12, an electromagnetic wave detection part 13, an ammeter 14, a motor 15, a control part 16, a monitor 17, an operation input part 18, and a visual camera 80.

The stage 11 fixes the solar cell panel 90 thereon with fixing means (not shown). Examples of the fixing means envisaged include means using a holder that holds a substrate, an adhesive sheet, a suction hole formed on the surface of the stage 11. However, any fixing means other than those listed above may be used as long as the solar cell panel 90 can be fixed. In the present embodiment, the stage 11 holds the solar cell panel 90 such that the irradiation part 12 and the electromagnetic wave detection part 13 are located on a light-receiving surface 91S side of the solar cell panel 90.

As shown in FIG. 2, the irradiation part 12 includes a femtosecond laser 121. The femtosecond laser 121 radiates, for example, pulsed light (pulsed light LP1) having a wavelength that includes a visible light range of 360 nm (nanometers) to 1.5 μm (micrometers). Specifically, linearly polarized pulsed light having a center wavelength close to 800 nm a frequency of several kHz to several hundreds MHz, and a pulse width of about 10 to 150 femtoseconds is radiated from the femtosecond laser. It is, of course, possible to configure the femtosecond laser to emit pulsed light having another wavelength range (e.g., visible light wavelength range such as the blue wavelength range (450 to 495 nm) or the green wavelength range (495 to 570 nm)).

The pulsed light LP1 radiated from the femtosecond laser 121 is split into two by a beam splitter B1, one of which (pulsed light LP11) is applied to the solar cell panel 90. At this time, the irradiation part 12 applies the pulsed light LP11 to the light-receiving surface 91S. Also, the pulsed light LP11 is applied to the solar cell panel 90 such that the optical axis of the pulsed light LP11 is incident obliquely on the light-receiving surface 91S of the solar cell panel 90. In the present embodiment, the irradiation angle is set such that the angle of incidence is 45 degrees. Note that the angle of incidence is not limited to the above angle, and may be changed as appropriate within a range of 0 to 90 degrees.

Figure 5:
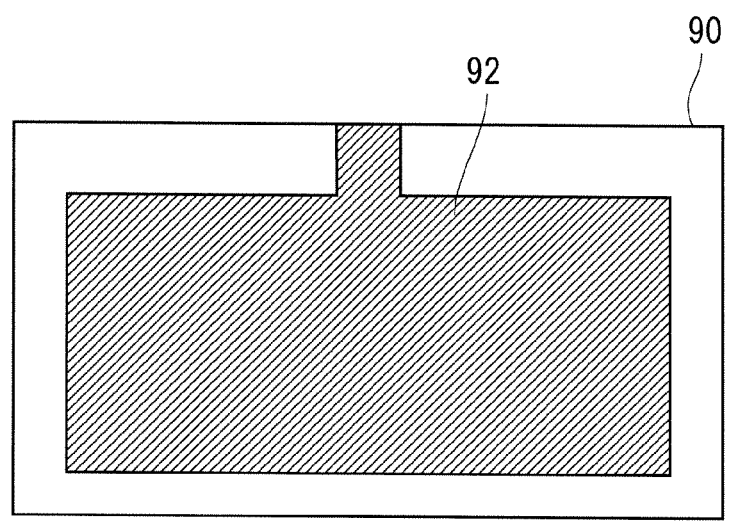
FIG. 5 is a plan view of the solar cell panel as viewed from the underside thereof.

FIG. 3 is a schematic cross-sectional view of the solar cell panel 90. FIG. 4 is a plan view of the solar cell panel 90 as viewed from the light-receiving surface 91S side. FIG. 5 is a plan view of the solar cell panel 90 as viewed from the underside thereof. The solar cell panel 90 is configured as a crystalline silicon solar cell panel. The solar cell panel 90 is configured as a crystalline silicon solar cell having a layered structure of a flat-plate shaped back electrode 92 made of aluminum or the like, a p-type silicon layer 93, an n-type silicon layer 94, an anti-reflective film 95, and a grid-shaped light-receiving surface electrode 96 that are stacked in this order from the bottom. The anti-reflective film 95 is made of, for example, silicon oxide, silicon nitride, or titanium oxide.

Of the two major surfaces of the solar cell panel 90, the one provided with the light-receiving surface electrode 96 serves as the light-receiving surface 91S. That is, the solar cell panel 90 is designed to generate power by receiving light from the light-receiving surface 91S side. The light-receiving surface electrode 96 may be a transparent electrode. Note that the photo device inspection apparatus 100 may be used to inspect a solar cell (amorphous silicon solar cell, etc.) other than the crystalline silicon solar cell. The amorphous silicon solar cell generally has an energy gap of 1.75 to 1.8 eV, which is greater than that (1.2 eV) of the crystalline silicon solar cell. In this case, by setting the wavelength of the femtosecond laser 121 to, for example, 700 nm or less, it is possible to favorably generate a terahertz wave in the amorphous silicon solar cell. By the same logic, the photo device inspection apparatus 100 is also applicable to other semiconductor solar cells (CIGS solar cell, GaAS solar cell, etc.).

The light-receiving surface 91S of the solar cell panel 90 has a desired texture structure in order to suppress reflective loss of light. To be specific, the light-receiving surface 91S may have asperities of several to several tens μm formed by, for example, anisotropic etching. V-shaped grooves formed by a mechanical method, or the like. In this way, the light-receiving surface 91S of the solar cell panel 90 is generally formed to be capable of receiving light as efficiently as possible. Accordingly, when pulsed light having a predetermined wavelength is applied to the solar cell panel 90, the pulsed light will easily reach a pn junction 97. For example, in the case of a solar cell panel, light primarily having a wavelength of 1 nm or less in a visible light wavelength range can easily reach the pn junction 97. In this way, by placing the solar cell panel on the photo device inspection apparatus 100 such that the major surface that receives light during use serves as the light-receiving surface, an electromagnetic wave pulse LT1 can be favorably generated.

A portion where the p-type silicon layer 93 and the n-type silicon layer 94 join serves as the pn junction 97 where a depletion layer is formed. Irradiating this area with the pulsed light LP11 generates an electromagnetic wave pulse and emits the electromagnetic wave pulse to the outside. In the present embodiment, the electromagnetic wave pulse detected by the electromagnetic wave detection part 13 is an electromagnetic wave pulse (hereinafter, referred to as the "electromagnetic wave pulse LT1") primarily having a terahertz range (frequencies of 0.01 to 10 THz).

Note that the substrate to be inspected by the photo device inspection apparatus 100 is not limited to the solar cell panel 90. Any substrate including a photo device that converts light including visible light into a current can be a target to be inspected by the photo device inspection apparatus 100. Specific examples of photo devices other than the solar cell panel 90 include image sensors such as a CMOS sensor and a CCD sensor. Some image sensors are known to include a light receiving element formed on a portion that serves as the underside of the substrate, on which a photo device is formed, during use. Even for such a substrate, it is possible to favorably detect the electromagnetic wave pulse LT1 by placing the substrate in the photo device inspection apparatus 100 such that the major surface from which light is received during use serves as the light-receiving surface.

Returning back to FIG. 2, the other pulsed light obtained as a result of splitting by the beam splitter B1 is incident on a detector 132 as probe light LP12 via a delay part 131, mirrors, and the like. The electromagnetic wave pulse LT1 generated by irradiation with the pulsed light LP11 is converged by parabolic mirrors M1 and M2 and is incident on the detector 132.

The detector 132 includes, for example, a photoconductive switch as an electromagnetic wave detecting element. When the probe light LP12 is applied to the detector 132 in a state in which the electromagnetic wave pulse is incident on the detector 132, a current corresponding to the electric field strength of the electromagnetic wave pulse LT1 instantaneously occurs in the photoconductive switch. The current corresponding to the electric field strength is converted into a digital amount via an I/V converter circuit, an A/D converter circuit, and the like. In this way, the electromagnetic wave detection part 13 detects the electric field strength of the electromagnetic wave pulse LT1 that has passed through the solar cell panel 90 in response to the irradiation with the probe light LP12. The detector 132 may be another element such as a non-linear optical crystal.

The delay part 131 is an optical element for continuously changing the arrival time of the probe light LP12 arriving at the detector 132 from the beam splitter B1. The delay part 131 is configured to be capable of being linearly moved along the incidence direction of the probe light LP12 by a movable stage (not shown). The delay part 131 includes a return mirror 10M that causes the probe light LP12 to travel back in the incidence direction.

The delay part 131 drives the movable stage under the control of the control part 16 to move the return mirror 10M, thereby changing the optical path length of the probe light LP12 with a high degree of precision. The delay part 131 thereby changes the time difference between the time when the electromagnetic wave pulse LT1 arrives at the electromagnetic wave detection part 13 and the time when the probe light LP12 arrives at the electromagnetic wave detection part 13. By the delay part 131 changing the optical path length of the probe light LP12, it is possible to delay the timing (detection timing or sampling timing) at which the electromagnetic wave detection part 13 (the detector 132) detects the electric field strength of the electromagnetic wave pulse LT1.

Another configuration is also conceivable in which the arrival time of the probe light LP12 arriving at the detector 132 is changed. To be specific, the electro-optical effect may be used. In other words, an electro-optical element whose refractive index is changed by changing the voltage to be applied may be used as a delay element. More specifically, the electro-optical element disclosed in Japanese Patent Application Laid-Open No. 2009-175127 may be used.

It is also possible to change the optical path length of the pulsed light LP11 (pump light), or the optical path length of the electromagnetic wave pulse 1 radiated from the solar cell panel 90. In this case as well, the time when the electromagnetic wave pulse LT1 arrives at the detector 132 can be delayed relative to the time when the probe light LP12 arrives at the detector 132. It is thereby possible to delay the detection timing of the electric field strength of the electromagnetic wave pulse LT1 at the detector 132.

The solar cell panel 90 is also connected to a reverse bias voltage applying circuit 99 that is configured to apply a reverse bias voltage across the back electrode 92 and the light-receiving surface electrode 96 during inspection. The application of the reverse bias voltage across the electrodes increases the width of the depletion layer of the pn junction 97, thus enlarging the internal electric field. This enables the amount of current generated by the pulsed light LP11 to be increased. Since the electric field strength of the electromagnetic wave pulse LT1 detected by the detector 132 can be increased, the sensitivity of the detector 132 when detecting the electromagnetic wave pulse LT1 can be improved. Note that the reverse bias voltage applying circuit 99 may be omitted.

As shown in FIG. 2, the ammeter 14 is connected to the solar cell panel 90. The ammeter 14 is connected to the back electrode 92 and the light-receiving surface electrode 96. As described above, upon irradiation of the solar cell panel 90 with the pulsed light LP11, free electrons and free holes are generated in the solar cell panel 90. Due to the internal electric field and diffusion, the free electrons migrate to the light-receiving surface electrode 96, and the free holes migrate to the back electrode 92. The ammeter 14 detects a current (direct current) generated by the migration of the free electrons and the free holes, and transmits data of the detected current to the control part 16. In the present embodiment, the pulsed light LP11 (e.g., having a repetition rate of 80 MHz to 1 GHz) is treated as approximate continuous light, and thereby the direct current generated by the solar cell panel 90 is detected.

Returning back to FIG. 1, the visual camera 80 is a CCD camera, and includes an LED or a laser as a light source for photography. The visual camera 80 is used to capture an image of the entire solar cell panel 90 or the position irradiated with the pulsed light LP11. Image data acquired by the visual camera 80 is transmitted to the control part 16 and displayed on the monitor 17 or the like.

The motor 15 drives an X-Y table (not shown) that moves the stage 11 on a two-dimensional plane. By moving the X-Y table, the motor 15 moves the solar cell panel 90 held on the stage 11 relative to the irradiation part 12. With the motor 15, the photo device inspection apparatus 100 can move the solar cell panel 90 to any position on the two-dimensional plane. The motor 15 also allows the photo device inspection apparatus 100 to inspect a wide range (inspection target area) of the solar cell panel 90 by applying the pulsed light LP11 to the range of the solar cell panel 90.

Instead of, or in addition to, moving the solar cell panel 90, moving means may be provided for moving the irradiation part 12 and the electromagnetic wave detection part 13 on the two-dimensional plane. In this case as well, the electromagnetic wave pulse LT1 can be detected in each area of the solar cell panel 90. A configuration is also possible in which the motor 15 is omitted, and the stage 11 is manually moved by the operator.

The control part 16 has a common computer configuration including a CPU, a ROM, a RAM, an auxiliary storage device (e.g., a hard disk), and the like, which are not shown in the diagram. The control part 16 is connected to the femtosecond laser 121 of the irradiation part 12, the delay part 131 and the detector 132 of the electromagnetic wave detection part 13, and the motor 15, and controls the operations of these units and receives data from these units.

To be more specific, the control part 16 receives data regarding the electric field strength of the electromagnetic wave pulse LT1 from the detector 132. The control part 16 also controls the movement of a movable stage (not shown) for moving the delay part 131 or receives, from the delay part 131, data regarding the position of the delay part 131, such as the moving distance of the return mirror 10M from a linear scale provided on the movable stage.

Also, the control part 16 includes a temporal waveform restoration part 21, an electromagnetic wave pulse analyzing part 23, an electromagnetic wave intensity distribution image generation part 25, a current intensity distribution image generation part 27, an image composition part 28, and an inspection position setting part 29. These processing parts are functions implemented by the CPU operating in accordance with a program (not shown). Note that part or all of these functions of the processing parts may be implemented by hardware such as a dedicated computation circuit.

The temporal waveform restoration part 21 constructs a temporal waveform of the electromagnetic wave pulse LT1 generated by the solar cell panel 90 on the basis of the electric field strength of the electromagnetic wave pulse LT1 detected by the electromagnetic wave detection part 13 (detector 132). To be specific, the time when the probe light arrives at the detector 132 is changed by moving the return mirror 10M of the delay part 131 to change the optical path length (first optical path length) of the probe light LP12. As a result, the detection timing of the electric field strength of the electromagnetic wave pulse LT1 at the detector 132 is changed. Then, the temporal waveform restoration part 21 detects the electric field strength of the electromagnetic wave pulse LT1 and plots the electric field strength on the time axis for each different phase so as to restore the temporal waveform of the electromagnetic wave pulse LT1.

The electromagnetic wave pulse analyzing part 23 analyzes the temporal waveform restored by the temporal waveform restoration part 21. The electromagnetic wave pulse analyzing part 23 detects the peak of the electric field strength, conducts frequency analysis using Fourier transformation, or the like for the temporal waveform of the electromagnetic wave pulse LT1 restored by the temporal waveform restoration part 21. The characteristics of the solar cell panel 90 are thereby analyzed.

The electromagnetic wave intensity distribution image generation part 25 generates an image (electromagnetic wave intensity distribution image) that visualizes the distribution of the electric field strength of the electromagnetic wave pulse LT1 radiated when the pulsed light LP11 is applied to the inspection target area (part or all of the solar cell panel 90) of the solar cell panel 90. The electromagnetic wave intensity distribution image is an image in which each irradiation location to which the pulsed light LP11 is applied is colored or shaded according to the detected electric field strength of the electromagnetic wave pulse LT1.

The current intensity distribution image generation part 27 generates an image (current intensity distribution image) that visualizes the current intensity distribution of current generated by the solar cell panel 90 when the pulsed light LP11 is applied to the inspection target area of the solar cell panel 90. The current intensity distribution image is an image in which each irradiation location to which the pulsed light LP11 is applied is colored or shaded according to the detected current intensity.

The image composition part 28 generates a new composite image that contains information regarding both of the electromagnetic wave intensity distribution generated by the electromagnetic wave intensity distribution image generation part 25 and the current intensity distribution generated by the current intensity distribution image generation part 27, through pixel computation using the electromagnetic wave intensity distribution image and the current intensity distribution image.

For example, in the case where the composite image is a difference image between the electromagnetic wave intensity distribution image and the current intensity distribution image, a location where there is an anomaly either in the emission of an electromagnetic wave or the generation of a current can be easily specified from the composite image.

The inspection position setting part 29 sets an area to be irradiated with the pulsed light LP11 in order to acquire the electromagnetic wave intensity distribution or the current intensity distribution. The inspection position setting part 29 displays an area designation screen on the monitor 17, which will be described later, and receives input of a designation from the operator via the operation input part 18. Then, the inspection position setting part 29 sets an area to be irradiated with the pulsed light LP11, on the basis of the input designation. The control part 16 controls the irradiation part 12 and the motor 15 so that the area set in the manner described above is scanned using the pulsed light LP11. As described above, the motor 15 constitutes a scanning mechanism.

The control part 16 is connected to the monitor 17 and the operation input part 18. The monitor 17 is a display apparatus such as a liquid crystal display, and displays various types of image information to the operator. The monitor 17 displays an image of the light-receiving surface 91S of the solar cell panel 90 captured by the visual camera 80, a temporal waveform of the electromagnetic wave pulse LT1 restored by the temporal waveform restoration part 21, and a result of the analysis performed by the electromagnetic wave pulse analyzing part 23. The monitor 17 also displays the electromagnetic wave intensity distribution image generated by the electromagnetic wave intensity distribution image generation part 25, the current intensity distribution image generated by the current intensity distribution image generation part 27, the composite image generated by the image composition part 28, and a screen for the inspection position setting part 29 to receive input of a designated operation. The monitor 17 also displays a GUI (graphical user interface) screen necessary to set inspection conditions or the like as appropriate.

The operation input part 18 includes various input devices such as a mouse and a keyboard. The operator can input various types of operations to the photo device inspection apparatus 100 via the operation input part 18. Note that the monitor 17 may be configured as a touch panel and function as the operation input part 18.

The above has been a description of the configuration of the photo device inspection apparatus 100, Next is a description of a specific example of the inspection of the solar cell panel 90 that can be executed by the photo device inspection apparatus 100.

1.2. Inspection of Solar Cell Panel 1.2.1. Inspection Example 1

FIG. 6 is a flowchart of Inspection Example 1 of the solar cell panel 90. Note that in the following description, operations of the photo device inspection apparatus 100 are performed under control of the control part 16 unless otherwise stated. Depending on the content of the steps, a plurality of steps may be performed in parallel, or the sequence in which the plurality of steps are executed may be changed as appropriate. First, a solar cell panel 90, which is an inspection target, is placed on the stage 11 (FIG. 6: step S11). At this time, as described above, the solar cell panel 90 is placed such that pulsed light LP11 is applied to the light-receiving surface 91S (in other words, the major surface that receives sunlight in a state in which the solar cell panel 90 is used).

After the solar cell panel 90 has been placed on the stage 11, the reverse bias voltage applying circuit 99 is connected to the back electrode 92 and the light-receiving surface electrode 96 of the solar cell panel 90, and a reverse bias voltage is applied (FIG. 6: step S12). When the reverse bias voltage is not applied, step S12 may be omitted. Also, the ammeter 14 is connected to the back electrode 92 and the light-receiving surface electrode 96 of the solar cell panel 90.

Next, the timing of detection of an electromagnetic wave pulse LT1 by the electromagnetic wave detection part 13 is set (FIG. 6: step S13). To be specific, the control part 16 controls the delay part 131, and thereby the position of the return mirror 10M is adjusted such that the timing of arrival of the probe light LP12 at the detector 132 is fixed to a desired detection timing. Note that the S/N ratio can be increased by setting the detection timing such that the detected electromagnetic wave intensity is as high as possible.

After the detection timing has been set, the motor 15 is driven so as to move the solar cell panel 90 on the two-dimensional plane, and thereby the inspection target area is scanned with the pulsed light LP11 (FIG. 6: step S14). Then, the electric field strength of the electromagnetic wave pulse LT1 radiated at each irradiation position to which the pulsed light LP11 is applied is detected by the detector 132, and the current generated at each irradiation position to which the pulsed light LP11 is applied is detected by the ammeter 14.

When the electric field strength of the electromagnetic wave pulse LT1 and the current intensity at each irradiation location to which the pulsed light LP11 is applied have been acquired in step S14, an electromagnetic wave intensity distribution image and a current intensity distribution image are respectively generated by the electromagnetic wave intensity distribution image generation part 25 and the current intensity distribution image generation part 27 and displayed on the same screen on the monitor 17 (FIG. 6: step S15). Note that, in step S15, a composite image obtained by combining an electromagnetic wave intensity distribution image and a current intensity distribution image may be generated by the image composition part 28 and displayed on the monitor 17.

Figure 8:
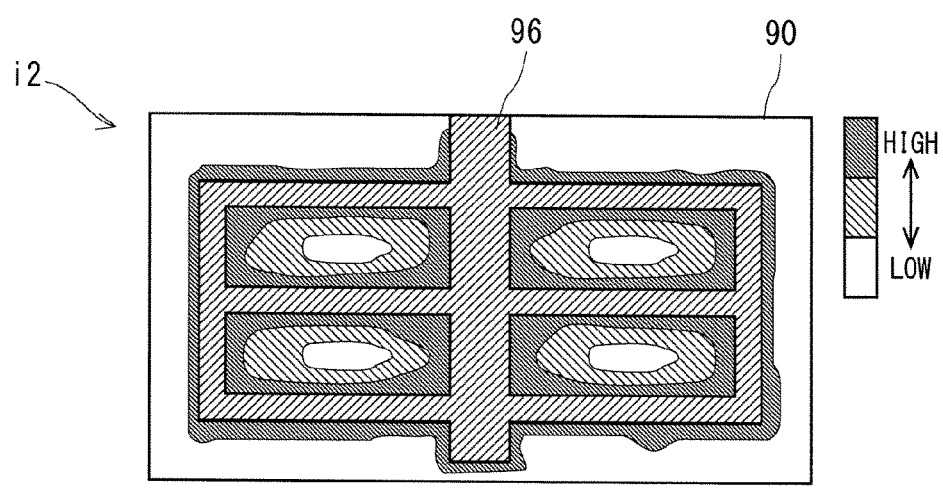
FIG. 8 illustrates a current intensity distribution image.

FIG. 7 shows an electromagnetic wave intensity distribution image i1. FIG. 8 shows a current intensity distribution image i2. With the electromagnetic wave intensity distribution image i1, the electric field strength distribution in the solar cell panel 90 can be easily recognized. Also, with the current intensity distribution image i2, the electric field strength distribution in the solar cell panel 90 can be easily recognized.

Returning back to FIG. 6, upon completion of the display of the images, the inspection position setting part 29 receives input of a designation of an area (temporal waveform restored inspection area) to be inspected after the temporal waveform of the electromagnetic wave pulse LT1 is restored (FIG. 6: step S16). In step S16, the operator designates an area for which detailed inspection is necessary, via the operation input part 18 while viewing the electromagnetic wave intensity distribution image and the current intensity distribution image displayed on the monitor 17. Then, the inspection position setting part 29 sets the designated area as the temporal waveform restored inspection area.

Note that the temporal waveform restored inspection area may be set automatically. For example, a configuration is possible in which a range of reference values within which the electromagnetic wave intensity or the current intensity is normal is pre-set, and the inspection position setting part 29 automatically sets a position at which an electromagnetic wave intensity or current intensity that falls outside the range of reference values has been detected, as the temporal waveform restored inspection area.

The photo device inspection apparatus 100 again irradiates the inspection area set in step S16 with the pulsed light LP11 and restores and analyzes the electromagnetic wave pulse LT1 (FIG. 6: step S17). The restoration and analysis of the electromagnetic wave pulse LT1 will now be described with reference to FIG. 9.

Figure 9:
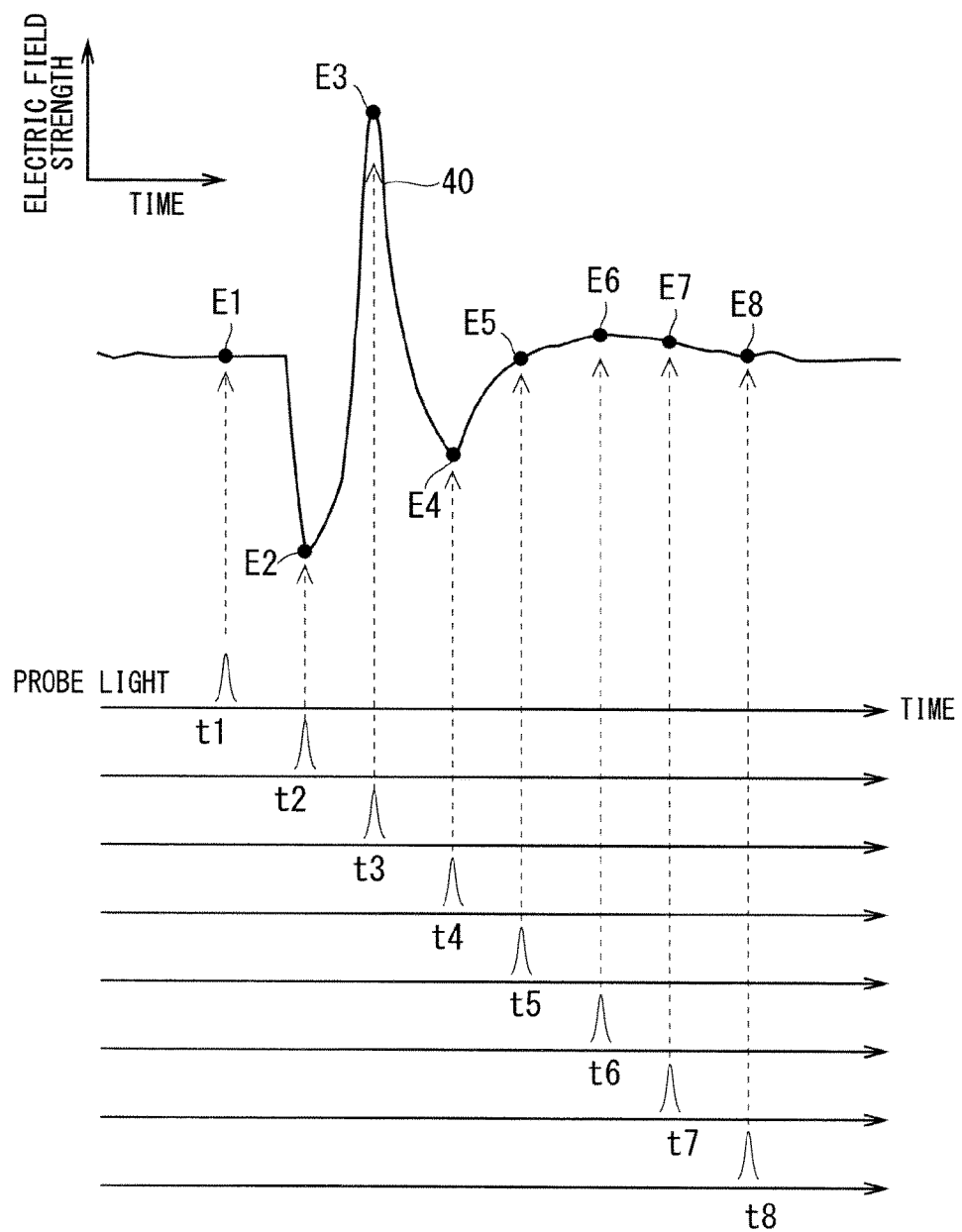
FIG. 9 illustrates an example of a temporal waveform of electromagnetic wave pulses restored by a temporal waveform restoration part.

FIG. 9 illustrates an example of a temporal waveform 40 of the electromagnetic wave pulse un restored by the temporal waveform restoration part 21. In the graph shown in FIG. 9, the horizontal axis indicates time, and the vertical axis indicates electric field strength. Also, in FIG. 9, under the graph showing the temporal waveform 40, a plurality of probe light LP12 having different arrival timings (t1 to t8) at the detector 132 as a result of being delayed by the delay part 131 are conceptually shown.

When the pulsed light LP11 is applied to the solar cell panel 90, the electromagnetic wave pulse LT1 having the temporal waveform 40 as shown in FIG. 9 repeatedly arrives at the detector 132 at a cycle corresponding to the pulse cycle of the pulsed light LP11.

In the case where, for example, the delay part 131 is adjusted such that the probe light LP12 arrives at the detector 132 at detection timing t1, an electric field strength having a value E1 is detected by the detector 132. By the delay part 131 being adjusted to delay the detection timing to each of t2 to t8, an electric field strength having each of values E2 to E8 is detected by the electromagnetic wave detection part 13. In this way, the detection timing is finely changed by controlling the delay part 131, and thereby the electric field strength of the electromagnetic wave pulse LT1 is measured with each detection timing. Then, the temporal waveform 40 of the electromagnetic wave pulse LT1 is restored by the temporal waveform restoration part 21 plotting the acquired electric field strength values on a graph along the time axis.

The temporal waveform 40 contains information regarding each process of generation, migration, and extinction of photoexcited carriers according to the irradiation with the pulsed light LP11. In other words, acquiring the temporal waveform 40 enables analysis of dynamics of photoexcited carriers, which enables more detailed analysis of defects (e.g., crystalline lattice defects, etc.) or characteristics of the solar cell panel 90. It is also possible to perform frequency analysis of the electromagnetic wave pulse LT1 by performing Fourier transformation on the temporal waveform 40.

As described above, with the photo device inspection apparatus 100 of the present embodiment, electromagnetic wave intensity data and current intensity data can be acquired using the pulsed light LP11 radiated from the same light source (femtosecond laser 121). This eliminates the need to prepare separate light sources in order to acquire respective data, thus suppressing an increase in the cost of the apparatus.

In Inspection Example 1 shown in FIG. 6, the electromagnetic wave intensity data and the current intensity data can be collected simultaneously through a single scan of the solar cell panel 90 with the same pulsed light LP11. Accordingly, efficient data collection is possible. A configuration is also possible in which the electromagnetic wave intensity data and the current intensity data are collected through different scans by scanning the inspection target area twice with the pulsed light LP11.

The electromagnetic wave intensity primarily reflects the state of the depletion layer, while the current intensity reflects the state of the entire photo device including the depletion layer. Accordingly, various kinds of information can be obtained from the solar cell panel 90 by acquiring the electromagnetic wave intensity and the current intensity. If, for example, there is an anomaly in either one of the detected current intensity and electromagnetic wave intensity at a specific position on the solar cell panel 90, it is possible to estimate that there is some kind of defect at the specific position. For example, if the current intensity is normal but the electromagnetic wave intensity is not normal at a specific position in the solar cell panel 90, it is possible to estimate that defects such as deterioration over time are likely to occur at that position although there is currently no problem in practical use.

Also, inspection in which the temporal waveform is restored requires adjustment of the delay part 131, and thus it takes a relatively long period of time to acquire the electromagnetic wave intensity data. In contrast, in Inspection Example 1 shown in FIG. 6, the inspection area on which the inspection requiring restoration of the temporal waveform is performed is limited based on the electromagnetic wave intensity distribution and the current intensity distribution, and therefore the solar cell panel 90 can be efficiently inspected.

Alternatively, the wavelength of the pulsed light LP11 applied may be changed between when the electromagnetic wave intensity is acquired and when the current intensity is acquired. It is possible to, for example, set the wavelength of the pulsed light LP11 to be applied to acquire the current intensity to 400 nm, and the wavelength of the pulsed light LP 11 to be applied to acquire the electromagnetic wave intensity to 800 nm.

1.2.2. Inspection Example 2

Figure 10:
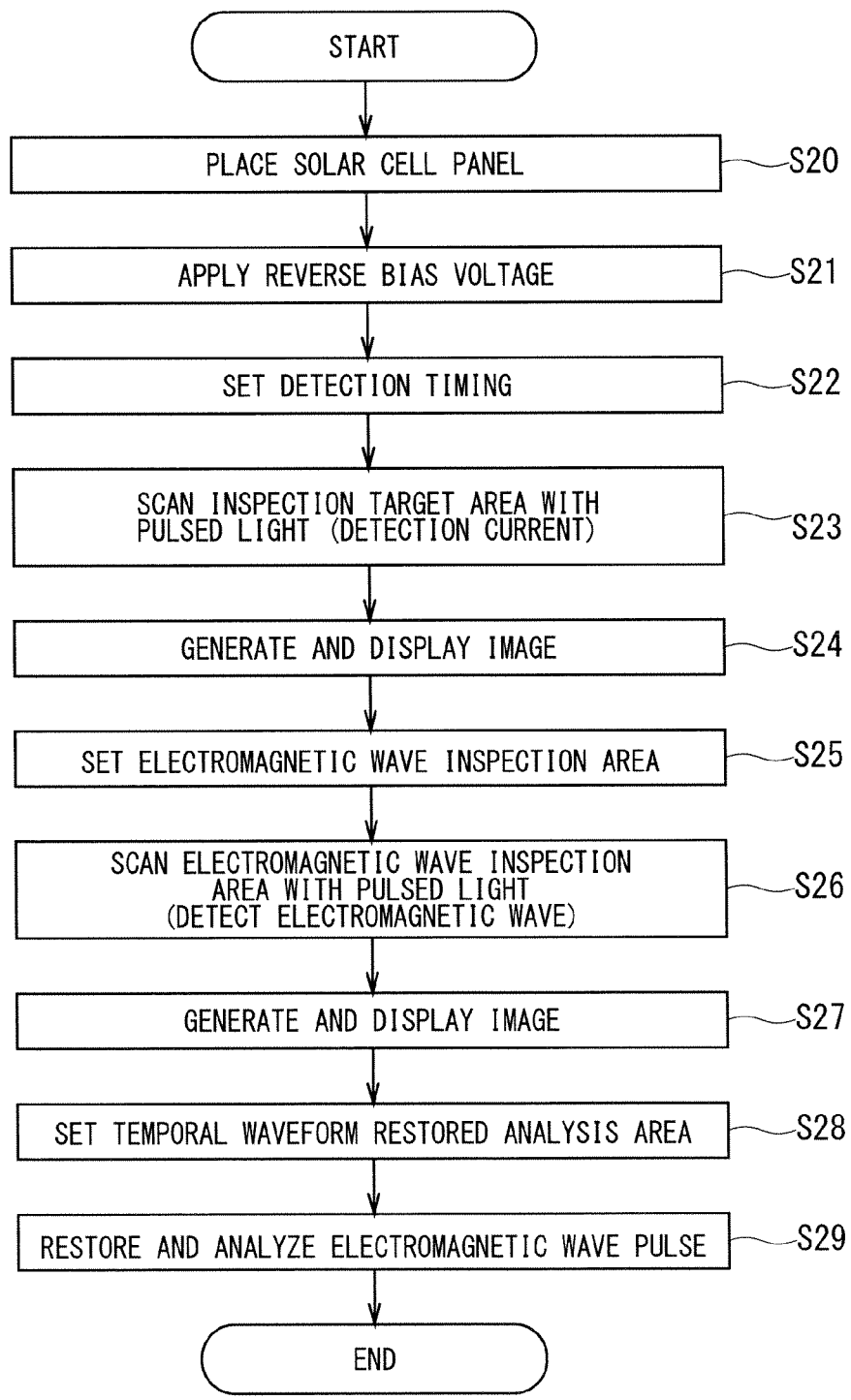
FIG. 10 is a flowchart of Inspection Example 2 of a solar cell panel.

FIG. 10 is a flowchart of Inspection Example 2 of the solar cell panel 90. In the flowchart of Inspection Example 2 shown in FIG. 10, the placement of the solar cell panel 90 (step S20), the application of the reverse bias voltage (step S21), and the setting of the detection timing (step S22) are respectively the same as those in steps 11 to 13 of Inspection Example 1 shown in FIG. 6, and thus a description thereof is not given here.

Upon completion of the setting of the detection timing in step S22, in Inspection Example 2 shown in FIG. 10, the photo device inspection apparatus 100 detects only current intensity data of the direct current when scanning the inspection target area with the pulsed light LP11 (step S23). Then, a current intensity distribution image based on the current intensity data acquired in step S23 is generated by the current intensity distribution image generation part 27 and displayed on the monitor 17 (step S24).

Next, the inspection position setting part 29 receives a designation of an area for which the electric field strength of the electromagnetic wave pulse LT1 needs to be acquired, and sets the designated area as the electromagnetic wave inspection area (step S25). To be specific, the operator performs an input operation to designate an electromagnetic wave inspection area while viewing the current intensity distribution image displayed on the monitor 17. Through this, the inspection position setting part 29 sets the electromagnetic wave inspection area.

The setting of the electromagnetic wave inspection area in step S25 may be performed automatically. For example, a configuration is possible in which a range of reference values within which the current intensity is normal is pre-set, and the electromagnetic wave inspection area is automatically set so as to include a position where a current intensity that falls outside the range of reference values has been detected, in the inspection target area. In this case, the inspection position setting part 29 functions as a determining part that determines whether or not the current intensity satisfies a pre-set reference value.

After the electromagnetic wave inspection area has been set, the photo device inspection apparatus 100 scans the electromagnetic wave inspection area with the pulsed light LP11 and detects the electric field strength of the radiated electromagnetic wave pulse LT1 (step S26). Then, an electromagnetic wave intensity distribution image based on the collected electromagnetic wave intensity data is generated by the electromagnetic wave intensity distribution image generation part 25 and displayed on the monitor 17 (step S27).

After the electromagnetic wave intensity distribution image has been displayed on the monitor 17, the inspection position setting part 29 sets a temporal waveform restored analysis area (step S28). Then, restoration and analysis of a temporal waveform are performed in the temporal waveform restored analysis area (step S29). Steps S28 and S29 are respectively substantially the same as steps S16 and S17 of Inspection Example 1 shown in FIG. 6, and thus a detailed description thereof is not given here.

In order to acquire highly reliable electromagnetic wave intensity data, it is necessary to apply the pulsed light LP11 to the same location repeatedly a prescribed number of times. For this reason, it generally takes a longer measurement time to acquire the electromagnetic wave intensity than it takes to acquire the current intensity. In contrast, according to Inspection Example 2 shown in FIG. 10, the range (electromagnetic wave inspection area) in which the electromagnetic wave intensity is acquired is narrowed down on the basis of the previously acquired current intensity distribution in the inspection target area. It is therefore possible to efficiently inspect the inspection target area in the solar cell panel 90.

If the current intensity data obtained when the pulsed light LP11 is applied to a given location during execution of step S23 (or in other words, during scanning for acquiring the current intensity data) falls outside the pre-set range of reference values, the electromagnetic wave intensity at that location may be acquired immediately. In this case, the current intensity data of the inspection target area and the electromagnetic wave data of the specific location can be acquired through a single scan, and therefore an improvement in inspection efficiency can be achieved.

In Inspection Example 2 shown in FIG. 10, the electromagnetic wave intensity data of the electromagnetic wave inspection area is collected after the current intensity data of the inspection target area has been collected. However, it is also possible to first collect the electromagnetic wave intensity data of the inspection target area and then collect the current intensity data of an area smaller than the inspection target area.

The electromagnetic wave inspection area for which the electromagnetic wave intensity is acquired does not necessarily need to be included in the area (current inspection area) for which the current intensity has been acquired. It is possible to, for example, set the electromagnetic wave inspection area so as to partially overlap the current inspection area, or so as to not overlap the current inspection area at all.

The electromagnetic wave inspection area, the current inspection area, and the electromagnetic wave restored inspection area may be set by the inspection position setting part 29 before inspection is started. In this case, for example, the operator may designate each inspection area in an image captured by the visual camera 80 before inspection is started.

2. Second Preferred Embodiment

FIG. 11 illustrates a schematic configuration of an irradiation part 12A and an electromagnetic wave detection part 13A of a photo device inspection apparatus 100A according to a second preferred embodiment. Note that in the following description, constituent elements that have the same functions as those of the photo device inspection apparatus 100 according to the first preferred embodiment are given the same reference numerals, and a description thereof is not given here.

As shown in FIG. 11, in the photo device inspection apparatus 100A, the pulsed light LP11 split by the beam splitter B1 passes through a transparent conductive film substrate (ITO) 19 and is incident normally on the light-receiving surface 91S of the solar cell panel 90. Then, the electromagnetic wave pulse LT1 radiated toward the light-receiving surface 91S from the solar cell panel 90 in response to irradiation with the pulsed light LP11 is reflected by the transparent conductive substrate 19, and thereafter converged by a lens and incident on the detector 132.

With this photo device inspection apparatus 100A as well, it is possible to detect the electromagnetic wave pulse LT1 radiated from the solar cell panel 90, as with the photo device inspection apparatus 100 according to the first preferred embodiment. It is also possible to measure the direct current generated by the solar cell panel 90 in response to irradiation with the pulsed light LP11, with the use of the ammeter 14 connected to the solar cell panel 90.

3. Third Preferred Embodiment

FIG. 12 illustrates a schematic configuration of an irradiation part 12B and an electromagnetic wave detection part 13B of a photo device inspection apparatus 100B according to a third preferred embodiment of the present invention. In the photo device inspection apparatus 100B, the pulsed light LP11 split by the beam splitter B1 is normally incident on the light-receiving surface 91S of the solar cell panel 90. Then, the electromagnetic wave pulse LT1 radiated toward (or in other words, passing through) the underside of the solar cell panel 90 from the solar cell panel 90 in response to irradiation with the pulsed light LP11 is incident on the detector 132 via parabolic mirrors M1 and M2, for example.

With this photo device inspection apparatus 100B as well, it is possible to detect the electromagnetic wave pulse LT1 radiated from the solar cell panel 90. It is also possible to measure the direct current generated by the solar cell panel 90 in response to irradiation with the pulsed light LP11 with the use of the ammeter 14 connected to the solar cell panel 90.

4. Fourth Preferred Embodiment

Figure 13:
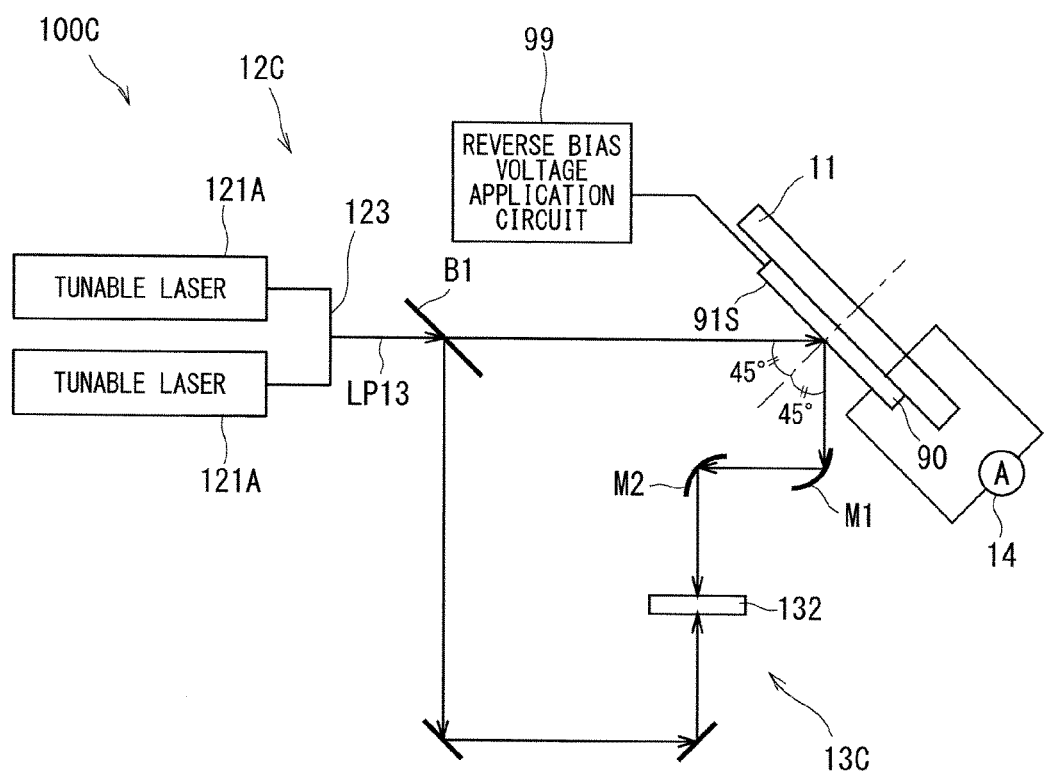
FIG. 13 illustrates a schematic configuration of an irradiation part and a detection part of a photo device inspection apparatus according to a fourth preferred embodiment of the present invention.

FIG. 13 illustrates a schematic configuration of an irradiation part 12C and an electromagnetic wave detection part 13C of a photo device inspection apparatus 100C according to a fourth preferred embodiment of the present invention. In the photo device inspection apparatus 100C, two laser light beams having slightly different oscillation frequencies are radiated from a pair of tunable lasers 121A. Then, the laser light beams are combined by a coupler 123 formed by an optical fiber, which is an optical waveguide, and thereby an optical beat signal corresponding to a difference frequency is generated. The difference frequency is configured to be capable of being adjusted arbitrarily by making the oscillation frequencies of the tunable lasers 121A variable. As the tunable lasers 121A, it is possible to use, for example, distribution feedback (DFB) lasers whose wavelength of laser light emitted can be changed substantially continuously (e.g., every 2 nm) by temperature control, or the like.

The laser light beams radiated from the tunable lasers 121A have a wavelength of, for example, 300 nm (nanometers) to 2 μm (micrometers), but the wavelength may be set as appropriate according to the magnitude of the band gap of the photo device to be inspected, for example.

In the case where laser light beams respectively having wavelengths of 779 nm and 781 nm are radiated from the two tunable lasers 121A, the coupler 123 can generate an optical beat signal having a frequency of about 1 THz, which is a difference frequency of the tunable lasers. Then, when mixed light L13 is applied to the solar cell panel 90, which is an inspection target, optical carriers are generated in the photoexcited carrier generation area and accelerated by the internal electric field, and thereby an electromagnetic wave (terahertz wave) corresponding to the frequency of the optical beat signal is radiated.

The mixed light L13 spilt by the beam splitter B1 is incident on the detector 132 via mirrors or the like, the detector 132 including a photoconductive switch (photoconductive antenna). The detector 132 detects the electromagnetic wave in synchronization with the frequency of the optical beat signal of the mixed light L13 incident on the detector 132. When the electromagnetic wave is incident on the detector 132, a current corresponding to the electric field strength of the electromagnetic wave is generated, and the amount of current is converted into a digital amount via an IN converter circuit, an A/D converter circuit, and the like. In this way, the electromagnetic wave detection part 13C detects the electric field strength of the electromagnetic wave radiated from the solar cell panel 90.

As described above, with the photo device inspection apparatus 1000 as well, it is possible to detect the electromagnetic wave radiated from the solar cell panel 90. Also, the ammeter 14 is connected to the solar cell panel 90. It is thereby possible to measure the direct current generated by the solar cell panel 90, with the use of the mixed light L13 radiated from the same optical sources as used to acquire the electromagnetic wave intensity. In the case of measuring the direct current, a configuration is also possible in which laser light is radiated from either one of the pair of tunable lasers 121A.

In the present embodiment, the tunable lasers 121A are used as the light sources. However, it is also possible to use a light source that emits continuous light, other than the laser light sources.

While the invention has been shown and described in detail, the foregoing description is in all aspects illustrative and not restrictive. It is therefore understood that numerous modifications and variations can be devised without departing from the scope of the invention. Also, the configurations described in the above embodiments can be combined as appropriate as long as there are no mutual inconsistencies.

What is claimed is:

1. A photo device inspection apparatus for inspecting a photo device, comprising:
   an irradiation part configured to irradiate said photo device with light from a light source;
   an electromagnetic wave detection part configured to detect an electromagnetic wave radiated from said photo device in response to irradiation with said light, wherein
   said irradiation part comprises a scanning mechanism configured to scan an inspection target area of said photo device with said light;
   a current detection part configured to detect a current generated by said photo device in response to irradiation with said light;
   a current intensity distribution image generation part coupled to the current detection part and configured to generate a current intensity distribution image that indicates an intensity distribution of said current generated in said inspection target area,
   said current intensity distribution image is an image generated based on a current value detected by said current detection part:
   an electromagnetic wave intensity distribution image generation part configured to generate an electromagnetic wave intensity distribution image that indicates an intensity distribution of said electromagnetic wave generated in said inspection target area; and
   an image composition part configured to composite said current intensity distribution image and said electromagnetic wave intensity distribution image.

2. The photo device inspection apparatus according to claim 1, wherein
   said light source is a femtosecond laser, and
   said detection part includes:
   a detector configured to detect said electromagnetic wave by receiving probe light radiated from said femtosecond laser; and a delay part configured to delay a timing of incidence of said probe light on said detector relative to a timing of incidence of said electromagnetic wave on said detector, said photo device inspection apparatus further comprising:

a temporal waveform restoration part configured to restore a temporal waveform of said electromagnetic wave on the basis of an electric field strength of said electromagnetic wave detected by operating said delay part.

3. The photo device inspection apparatus according to claim 2, further comprising:

an inspection position setting part configured to set a position to which said irradiation part applies said light, in order to restore said temporal waveform.

4. The photo device inspection apparatus according to claim 1, further comprising:

a determining part configured to determine whether or not said current detected by said current detection part has an intensity that satisfies a pre-set reference value;

wherein said scanning mechanism scans an area in which said reference value is not satisfied with said light, and said electromagnetic wave detection part detects an electromagnetic wave generated by the scanning.

* * * * *